(12) United States Patent
Lei et al.

(10) Patent No.: US 6,277,199 B1
(45) Date of Patent: Aug. 21, 2001

(54) CHAMBER DESIGN FOR MODULAR MANUFACTURING AND FLEXIBLE ONSITE SERVICING

(75) Inventors: Lawrence Chung-Lai Lei, Milpitas; Son Trinh, Cupertino, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/233,391

(22) Filed: Jan. 19, 1999

(51) Int. Cl.⁷ .................................................. C23C 16/00
(52) U.S. Cl. ...................... 118/696; 118/698; 118/715; 118/719
(58) Field of Search .................................... 118/696, 698, 118/715, 719

(56) References Cited

U.S. PATENT DOCUMENTS 4,592,306 * 6/1986 Gallego .................................. 118/719
5,587,039 * 12/1996 Salimian .............................. 156/345
5,611,655 * 3/1997 Fukasawa ............................. 414/217

FOREIGN PATENT DOCUMENTS 61-96727 * 5/1986 (JP) ...................................... 118/719

* cited by examiner

Primary Examiner—Richard Bueker
(74) Attorney, Agent, or Firm—Thomason, Moser & Patterson, L.L.P.

(57) ABSTRACT

The present invention provides a semiconductor fabrication process and cluster tool utilizing individual gas boxes for each of the processing chambers. These individual gas boxes provide an enclosure where groupings of related gas components may be positioned above and/or adjacent to the semiconductor processing chamber requiring those objects or components. The proximity of the individual gas boxes to the respective processing chambers facilitates the delivery of gases to the chamber as needed. Furthermore, the individual gas panels enable a modular design comprising a processing chamber and gas panel combination. This modular design allows individual chambers and their respective gas panels to be run through various pre-installation tests.

14 Claims, 7 Drawing Sheets

CHAMBER DESIGN FOR MODULAR MANUFACTURING AND FLEXIBLE ONSITE SERVICING

BACKGROUND OF THE INVENTION

1. Field of the Invention

The present invention relates to a semiconductor processing system design. More particularly, the invention relates to a semiconductor processing system and gas panel that provides flexible system configuration, onsite servicing and reduced footprint.

2. Background of the Related Art

Cluster tools for fabrication of semiconductor devices and flat panel displays provide a group of interconnected process chambers and the utilities necessary to operate the chambers. It is not uncommon for a cluster tool to have six or more processing chambers with each chamber having multiple gas supply lines. The total number of gas supply lines can easily exceed twenty. The types of gases typically supplied to these chambers include, but are not limited to, inert gases, reactive deposition gases and reactive etch gases.

For the purpose of controlling and optionally containing the gas supplies, it is desirable to have a common area or enclosure referred to as a gas panel or gas box for isolating control valves, safety shut off valves, actuators, mass flow controllers, associated electronics and the like. The gas box typically sits immediately adjacent to a group of processing chambers, such as adjacent to the chambers attached to a cluster tool, with one side facing the chambers through which each supply line passes. Each gas supply line will have at least one control valve and at least one coupling for connecting a supply line to a chamber. Therefore, the area immediately between the gas box and the processing chambers contains many rigid stainless steel pipes extending in many different directions.

Frequently, even a pipe accurately fabricated according to the construction drawings will run into an obstruction or fail to mate with the appropriate coupling at the chamber or the gas box. The rework required to modify the pipe according to the field dimensions can require as much as two to six hours of skilled labor and adds significantly to the cost of installing this type of equipment.

FIG. 1 is a schematic top view of a cluster tool 10 showing the position and size of a conventional gas panel 12. The individual semiconductor processing chambers 14, which may be any combination of chamber types, are coupled to two transfer chambers 16. Wafer transfer robots 18,20 are positioned within each of the transfer chambers 16 in order pass wafers from one chamber 14 to another chamber 14 or from one transfer chamber 16 to the other transfer chamber 16. Furthermore, the robot 20 is able to reach a load lock chamber 22 where wafers are staged before and after processing in the cluster tool 10. Together, the gas panel 12, transfer chambers 16, processing chambers 14, and the load lock chamber 22 establish the overall footprint of the cluster tool 10.

Many of these chambers require a supply of more than one type of gas in order to perform the intended process on a wafer or a substrate. These gases are typically supplied to the cluster tool through a gas panel or gas box positioned adjacent to the cluster tool. The gas panel is an enclosure which houses a variety of gas controlling components including, but not limited to, flow control valves, flow rate meters, and vials of various volatile liquid precursors, such as dimethyl aluminum hydride (DMAH), that are vaporized for use in the chambers by bubbling a carrier gas through the liquid precursor or through the use of other methods. In this manner, the gas panel functions to isolate the most likely sources of gas leaks from the clean room environment and facilitate collection and disposal of any gas leaking from the components housed therein. Furthermore, the gas panel enables easy access to the gas controlling components for maintenance and installation.

The conventional gas panel 12 houses all of the control valves, shutoff valves, flow meters, volatile liquids and the like that are needed for the operation of the cluster tool 10 and its many chambers 14,16. Gas from the gas panel 12 is typically delivered to the chambers 14,16 from below the chambers 14,16 through stainless steel tubing that is disposed beneath an elevated, false flooring (not shown). Access to the chambers 14,16 for maintenance and installation is maintained by setting the gas panel 12 back a distance 24 from the end of the cluster tool and by installing the tubing beneath the floor.

The process chambers may include, but are not limited to, chemical vapor deposition chambers, physical vapor deposition chambers, etch chambers, cool down chambers and rapid thermal annealing chambers. These chambers variously may require voltage sources, heaters, actuators, vacuum pumps and various sources of reactive or inert gases.

The cluster tool and gas panel are operated inside a clean room in order to prevent or reduce the number of particulate contaminants coming into contact with the semiconductor substrate. However, there is a considerable expense required to operate a clean room and it is desirable to minimize the size of the clean room. It is the cluster tool's footprint (area of floor space) that determines the amount of floor space required in the clean room and the volume of air required to be circulated in order to maintain the contaminant concentration in the air below a given level. Typically, the clean room has a substantial amount of unused space above the cluster tool.

Many different efforts have been directed at reducing the footprint of these processes or devices. Examples of these efforts include redesign of transfer chambers and robots, altering the geometrical configurations of process chambers, relocation of equipment outside the clean room where possible and the like.

Despite these efforts, there is a continuing incentive and need to reduce the footprint of semiconductor processing equipment. It would be desirable to have a cluster tool, complete with process chambers and ancillary equipment, having a smaller footprint without significantly affecting access to the process chambers for maintenance or installation purposes.

SUMMARY OF THE INVENTION

The present invention provides a modular system for fabricating integrated circuits. The system comprises a transfer chamber having a plurality of stations adapted to selectively connect a vacuum processing chamber to the transfer chamber, a gas supply manifold having a first end in communication with a gas source and a plurality of second ends disposed at each of the plurality of stations and adapted to selectively connect a gas box, a vacuum processing chamber adapted to selectively connect to the transfer chamber at one of the plurality of stations, and a gas box having a gas supply line having a first end in communication with the vacuum processing chamber, a second end adapted to selectively connect with one of the plurality of second ends of the gas supply manifold, and a flow control member disposed between the first and second ends, wherein the vacuum processing chamber and the gas box may selectively connect to any one of the plurality of stations. It is preferred to rigidly or fixedly couple the gas box to the vacuum processing chamber. Additionally, the vacuum processing chamber may have a support member for securing the gas box above the vacuum processing chamber. Alternatively, the gas box may be secured next to the vacuum processing chamber, yet preferably still be supported by the chamber or chamber supported structure.

The present invention also provides a system for fabricating integrated circuits that comprises a transfer chamber having a plurality of stations adapted to receive a processing unit, a plurality of processing units in communication with the transfer chamber, each of the plurality of processing units having a vacuum processing chamber and a gas box, wherein each gas box has a plurality of gas supply lines having a first end in communication with the vacuum processing chamber, a second end in communication with a gas source and a control member disposed in the gas supply line between the first and second ends. The control member preferably provides selective delivery of a gas into the vacuum processing chamber in the same processing unit and no gases to any other vacuum processing chamber. It is also preferred that the system further comprise a gas supply manifold having a first end in communication with a gas source and a plurality of second ends terminating adjacent each of the plurality of processing units for selective connection between one of the plurality of second ends with a gas supply line of a gas box. The system may also include a hood covering the gas supply manifold between the first and second ends. Optionally, the second ends of the gas supply lines of the gas box are disposed in a fixed relationship to each of the plurality of vacuum processing chambers, preferably so that connecting a vacuum processing chamber to the transfer chamber disposes the second end of the gas supply lines of the gas box immediately adjacent the second ends of the gas supply manifold. As discussed above, the gas box may be positioned above or to the side of the vacuum processing chamber.

Another system of the present invention for fabricating integrated circuits comprises: a transfer chamber having a plurality of stations having a slit valve for receiving vacuum processing chambers, a plurality of gas manifolds communicating a gas source to a terminal end positioned in a standard configuration relative to the slit valve at each of the stations, and a processing unit comprising a vacuum processing chamber having an opening for communicating with the slit valve and a gas box having one or more gas lines positioned in a standard configuration for communicating with the terminal ends of the gas manifolds, wherein the processing unit may be selectively connected at any one of the plurality of stations. The system may further comprise a process control computer having a plurality of electronic sensor wires and control wires extending to a first connector positioned at any one of the plurality of stations, wherein each processing unit further comprises a plurality of sensors and controllers having a plurality of electronic sensor wires extending to a second connector, wherein the second connector may be selectively connected to the first connector at any one of the plurality of stations.

Finally, the present invention may be specifically used in a cluster tool having a transfer chamber and a plurality of vacuum processing units in communication with the transfer chamber. One or more of the vacumn processing units may comprise a vacuum processing chamber suitable for fabricating semiconductor devices; and a gas box having a plurality of gas supply lines and a control member disposed in each of the plurality of gas supply lines providing selective delivery of a gas into the vacuum processing chamber, wherein each of the plurality of gas supply lines have a first end in communication with a gas source and a second end in communication with the vacuum processing chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
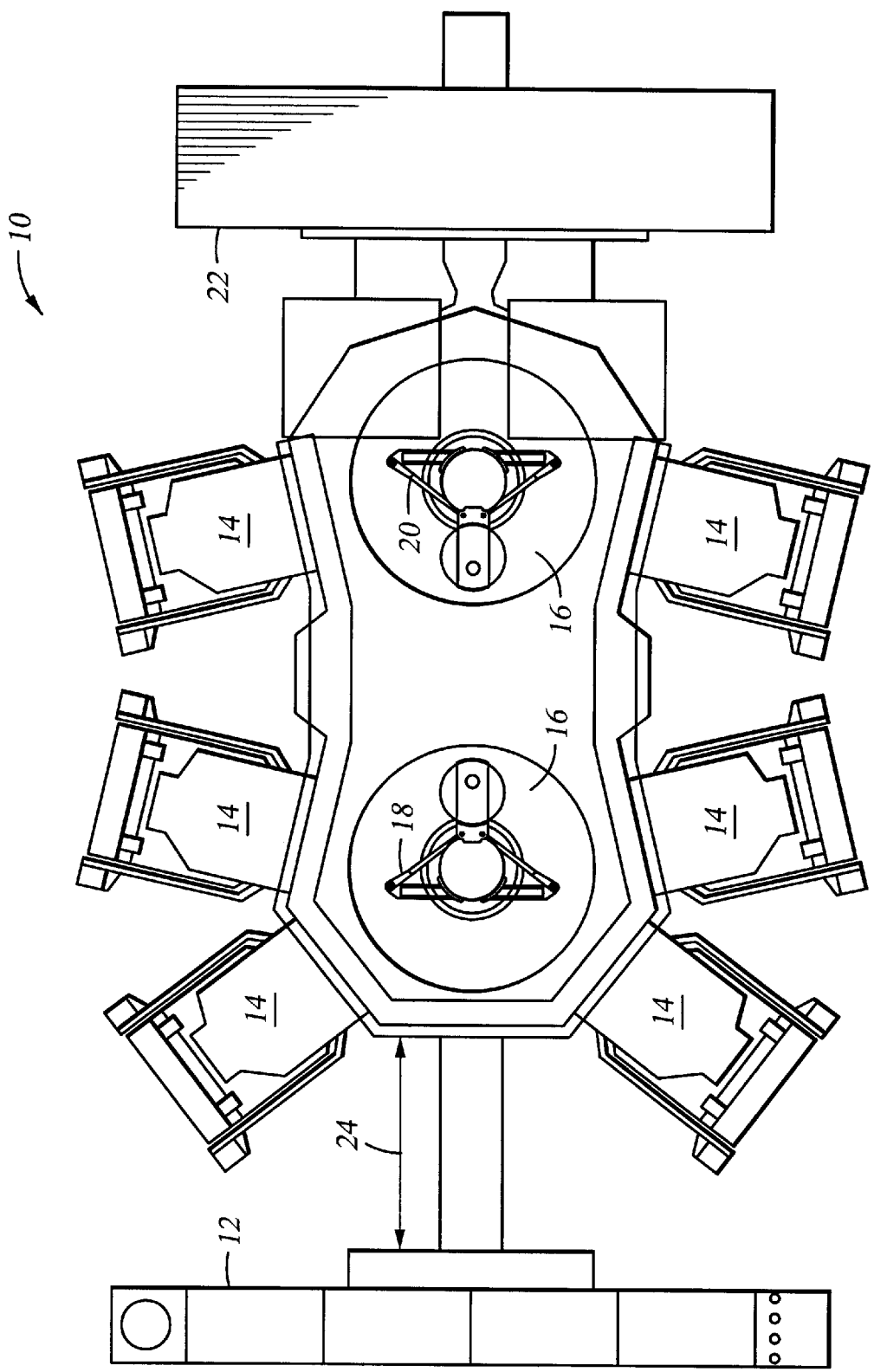
FIG. 1 is a schematic top view of a cluster tool showing the position and size of a conventional gas panel.

The present invention relates to semiconductor processing chambers and their respective gas box components. The invention readily lends itself for use in single chamber processing systems or multiple chamber processing systems, such as the Endure® or Centura® platforms available from Applied Materials, Inc., located in Santa Clara, Calif. The invention provides a reduced footprint without significant modification to a chamber or cluster tool by disposing the gas box generally horizontally in a position above the processing system or chambers.

One aspect of the present invention provides for individual gas boxes for each of the semiconductor processing chambers. These individual gas boxes provide an enclosure where groupings of related gas components may be positioned above and/or adjacent to the semiconductor processing chamber requiring those objects or components. The proximity of the individual gas boxes to the respective semiconductor processing chambers facilitates the delivery of gases to the chamber as needed.

Another aspect of the invention provides a modular semiconductor processing chamber and gas panel combination. This modular design allows individual chambers and their respective gas panels to be run through various pre-installation tests. After installation and start-up, the proximity of the respective gas panels to their process chamber facilitates maintenance of a particular process. The respective gas boxes comprise groupings of gas control components. The gas boxes are preferably positioned at a sufficient distance substantially vertically above the process chamber so that the lid of the chamber may open and allow access to any other portion of the process chamber or to the gas panel. Alternatively, the gas boxes may be positioned to the side of the process chamber so long as the gas panel does not pose a significant additional obstruction to access to the process chamber. Regardless of the exact position of the gas box with respect to the process chamber, it is preferred to have the gas box coupled to the same or similar structure supporting the process chamber so that the process unit comprising the process chamber and the gas box serving that process chamber act as a single module that can easily interface with a cluster tool having a gas supply manifold.

Yet another aspect of the invention provides a method and apparatus for distributing gases and gas control members to a cluster tool. More particularly, gas supply lines are provided to the individual gas panels or grouping of gas control members for individual delivery and control of the gases to the process chambers as dictated by various process control devices. Most preferably, the groupings of gas control members in each gas panel are disposed over the individual process chambers or otherwise disposed to minimize the extent to which the gas panel extends beyond the footprint of the chambers. Electronic gas control members are preferred over other known control members, such as pneumatic and hydraulic controllers.

In yet a further aspect of the invention, the gas panel is provided as a hood extending over at least a portion of the cluster tool. The hood provides a degree of isolation of the gas containing components and gas supply manifolds from the rest of the clean room. Additionally, the hood may provide mechanical support for the gas supply manifolds or lines, exhaust lines, and gas control components typically found in a gas box or panel.

With respect to any of the above mentioned aspects of the invention, it should be noted that the gas panels may be suspended from the ceiling of the clean room or more preferably supported by a plurality of posts disposed around the perimeter of the cluster tool. With respect to certain cluster tools, such as the ENDURA®, the support posts may be placed adjacent to or extended from existing posts used to support the cluster tool itself or individual gas chambers. Furthermore, it is most preferred that the individual gas panel members receive either a major portion or all of their support from a position that does not interfere with access to the chamber or to the gas components in the gas panel. For example, an individual gas panel mounted vertically above a process chamber may be mounted to the hood or to support posts positioned adjacent the interface between the process chamber and the transfer chamber of the cluster tool. In this manner, the process chamber and gas panel may be accessed without significant restriction from two or three sides. Access to the fourth side, adjacent the transfer chamber is already somewhat limited and is not significantly affected by the presence of the hood or the posts extending above the cluster tool.

While it is within the scope of the present invention to provide a portion of the gas control components or gas supplies in a conventional free-standing gas panel and to provide other specific components in the individual gas panels associated with individual process chambers, it is preferred that the individual gas panels contain all of the gas control components necessary to service a particular process chamber. These individual gas panels, in combination with a hood disposed above the cluster tool for containing various gas supply manifolds and electronic control and sensor signal wires, allow replacement of the conventional free-standing gas panel and provide a net reduction in the footprint of the processing system in the clean room.

Figure 2:
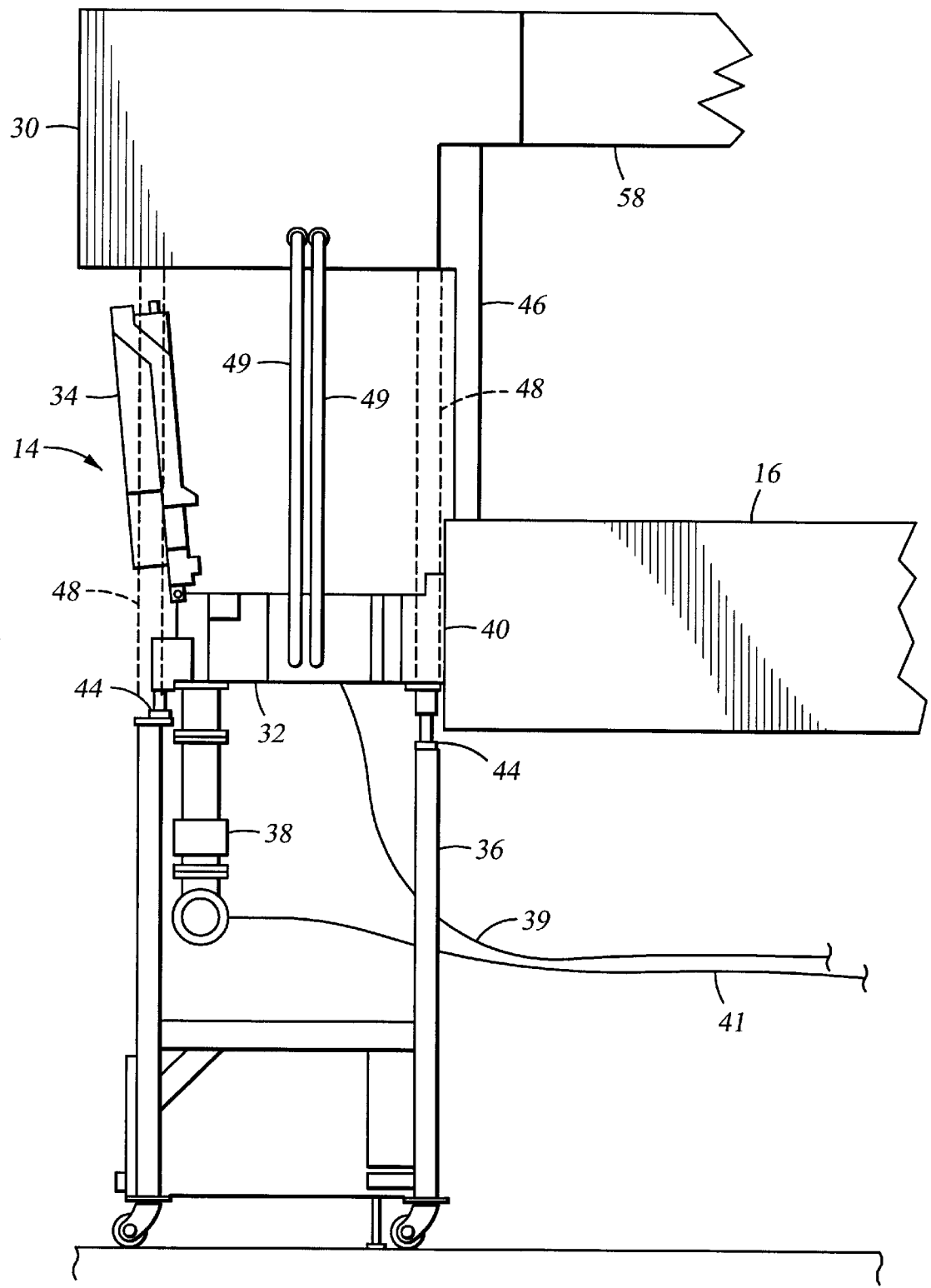
FIG. 2 is a side view of an individual process chamber and a gas panel disposed above the process chamber.

FIG. 2 is a side view of an individual process chamber 14 and a gas panel 30 of the present invention disposed above the process chamber 14. The process chamber 14 comprises a main chamber portion 32, an upwardly opening lid 34 hinged to the main chamber portion 32, and a vacuum pump system 38 disposed below the main chamber portion 32 in fluid communication with the chamber 32. Preferably, the chamber 14 is provided on a cart 36 that elevates the chamber 14 so the front edge 40 of the chamber may be aligned with the transfer chamber 16 allowing wafers to be transferred through mating openings or slit valves (not shown) disposed therebetween. It is useful to equip the carts with wheels 42 to facilitate easy exchange of the chamber 14 with another chamber 14 of the same type (i.e., replacement for maintenance or upgrades) or of a different type (ie., substitution to reconfigure the cluster tool for a different process sequence). It is also useful to equip the carts with vertical adjustment devices 44 to allow for a precise leveling and alignment despite minor variations from one installation to the next installation. Electrical supply cables 39, 41 may be routed to the chamber 14 and vacuum pump system 38 in any manner, but the cables 39,41 are preferably provided from underneath the transfer chamber 16.

A gas panel 30 is disposed substantially vertically above the chamber 14. In the particular embodiment of FIG. 2, the gas panel 30 is supported on the transfer chamber or platform 16 by a support member or bracket 46. While the support member 46 may provide independent support of the individual gas panel 30, the support member 46 may be used in cooperation with a plurality of similar support members 46 positioned around the platform to support a plurality of gas panels 30 and/or the hood member 58. Suspending the gas panel from the support member 46 (or other elevated support structure) minimizes the number of obstructions around the chamber that reduce free access to the chamber or platform for maintenance, installation or the like. The only significant obstruction to free access to the chamber 14 is the specific gas supply lines 49 that must extend downward from the gas panel 30 to connect with the main portion 32 of the chamber 14. It should be noted that the gas supply lines 49 may also be disposed along side the support 46 in order to minimize, or at least move, the obstruction.

As an alternative to support members 46, the gas panel 30 may be supported on the cart 36 by extending the support members 48 (shown in dashed lines) a sufficient distance above the chamber 14 to allow free opening of the lid 34. While the support members 48 extending from the cart may obstruct access to the chamber more than the support members 46 extending from the platform, this arrangement allows the chamber 14 and gas panel 30 to be fully connected, and perhaps even tested or run through a pre-startup status check, prior to connecting the chamber 14 to the transfer chamber 16. By reducing the number of steps and the amount of time required to install and startup a processing chamber, the cluster tool will experience less downtime and the clean room space will be more efficiently used.

Figure 3:
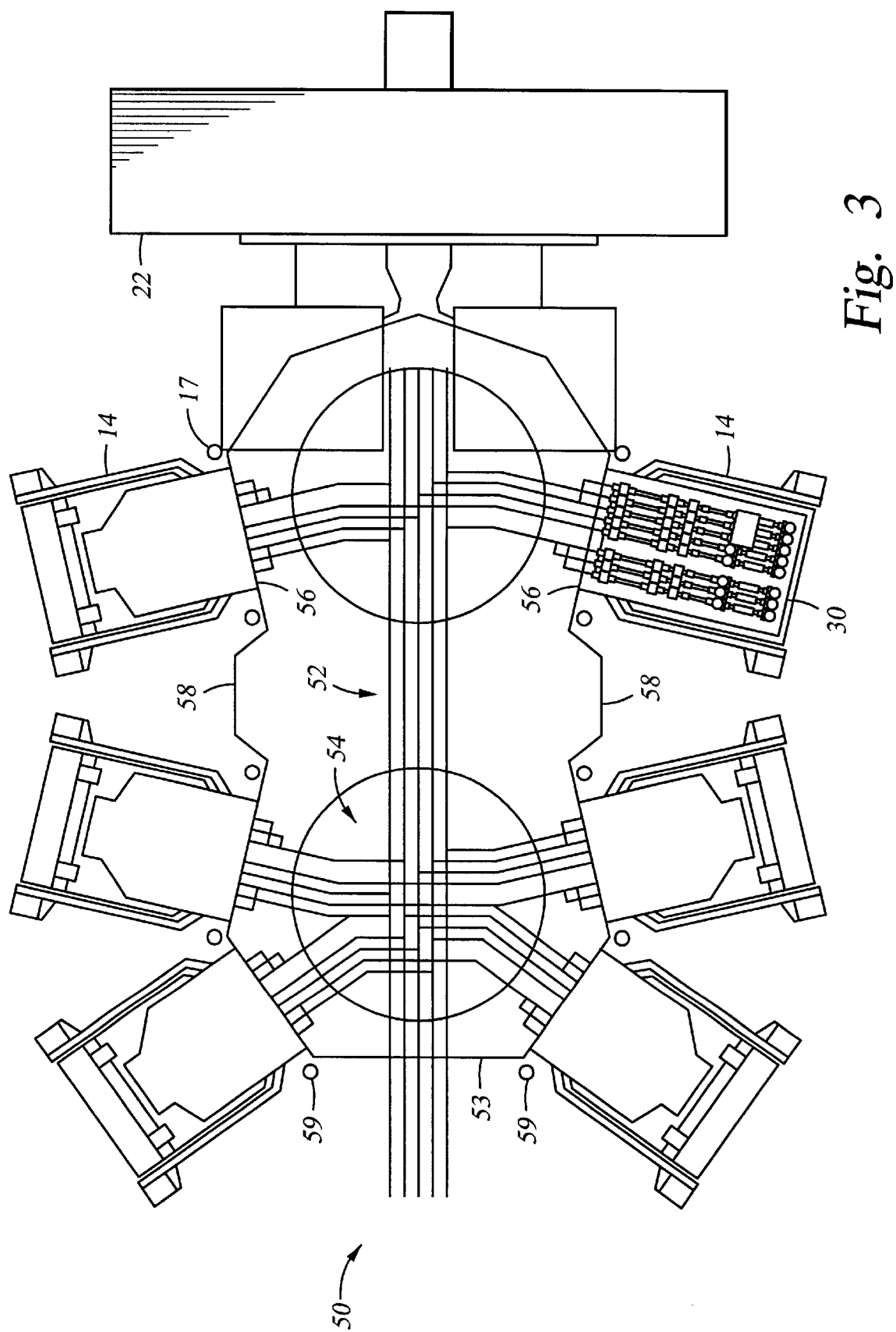
FIG. 3 is a top view of a gas panel according to the present invention having individual groupings of gas control components disposed vertically above respective processing chambers.

FIG. 3 is a top view of a gas panel 30 according to the present invention having individual groupings of gas control components disposed vertically above the respective processing chambers 14. Many of the gases required by the processing chambers 14 are provided through gas lines 50. The gas lines 50 enter the housing 58 which isolates the gas lines from the clean room environment around the cluster tool. Inside the housing 58, one or more of the plurality of gas lines 50 may form a gas delivery manifold 52 having a plurality of gas delivery lines 54 delivering gas to a plurality of the processing stations 56 supported on the cluster tool. The term "processing station", as used herein, means those positions on a cluster tool which mount a processing chamber. Furthermore, in accordance with the present invention, the term "processing station" may also be used to define those positions established by the housing 58 for connection of an individual gas panel 30 to the terminal ends of one or more gas delivery manifolds 52 or individual gas delivery lines 54. It is preferred to have the processing station of the gas supply manifold disposed substantially horizontally in a position vertically above the processing station of the cluster tool. The housing or hood 58 preferably covers the gas delivery manifold 52,54 and provides structural support for the gas delivery lines 54 and/or provide connections and support for the processing chambers 14. The housing 58 may be suspended from the ceiling or conveniently supported on a plurality of supports 59 disposed around the perimeter of the cluster tool.

Figure 4:
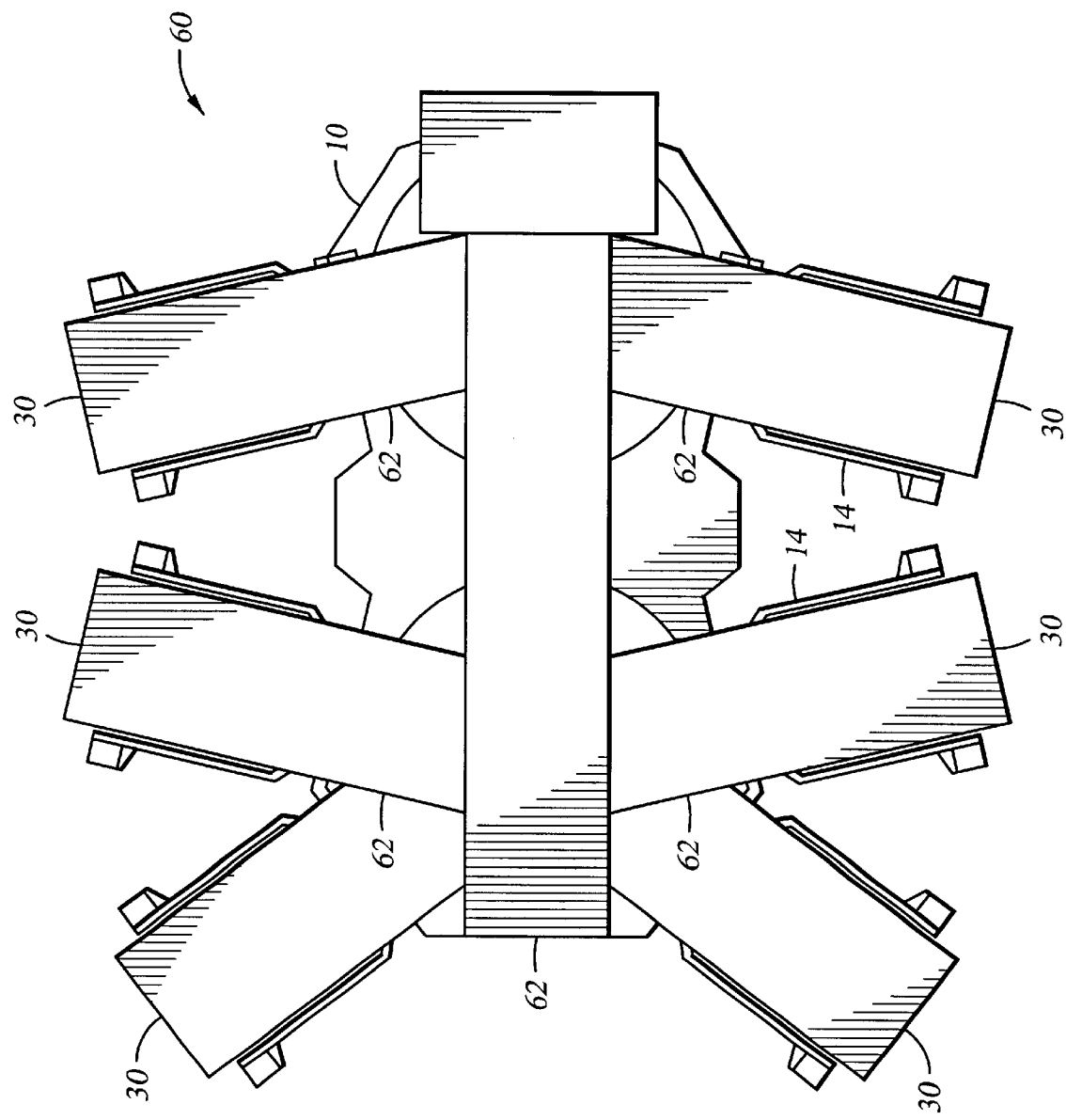
FIG. 4 is a top view of a gas panel according to the present invention showing the hood arrangement which isolates the gas control components and supply lines from the environment from around the clean room.

FIG. 4 is a top view of a gas panel system 60 according to the present invention showing a hood configuration 62 which isolates the gas control components and gas delivery and supply lines from the environment within the clean room. The configuration of the hood 62 is much simpler than the hood 58 of FIG. 3, yet it provides the same functions and features.

Figure 5:
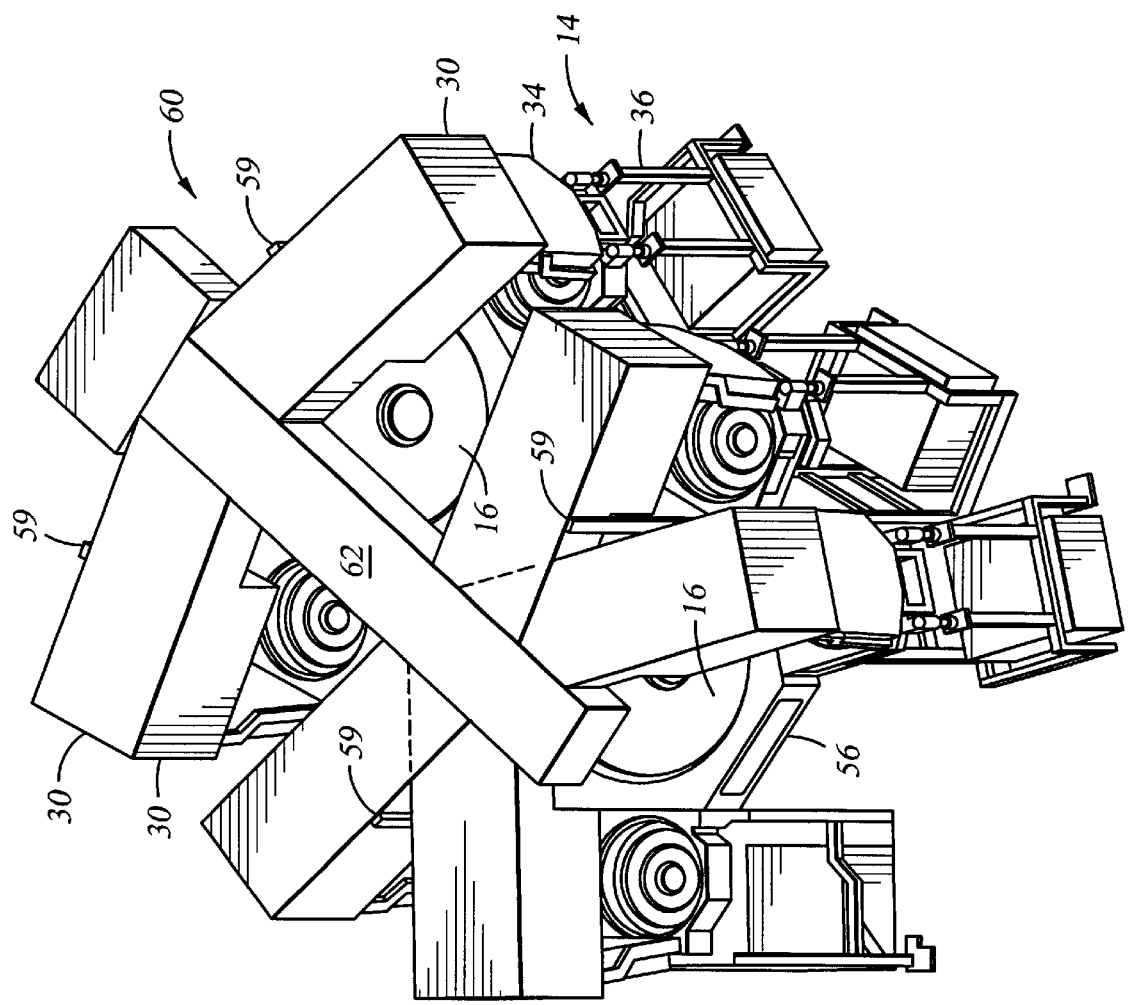
FIG. 5 is a perspective view of the gas panel shown in FIG. 4.
Figure 6:
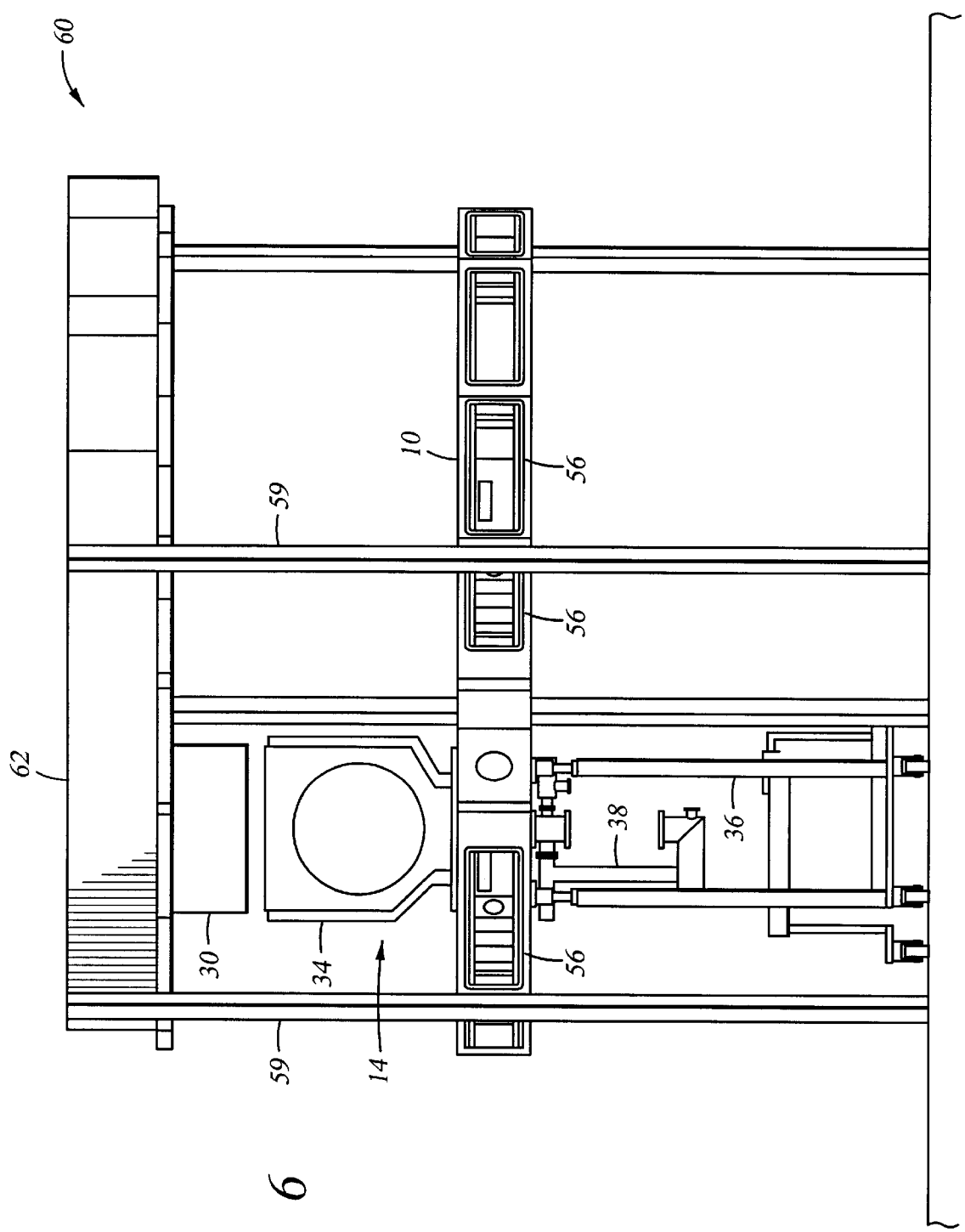
FIG. 6 is a side view showing a cluster tool with a single processing chamber having its lid open.

FIGS. 5 and 6 are perspective and side views, respectively, of the gas panel system 60 shown in FIG. 4. The system 60 comprises a hood 62 and individual gas panels 30 supported on four supports 59. The cluster tool 10 shows the processing chambers 14 having the chamber lids 34 open.

Figure 7:
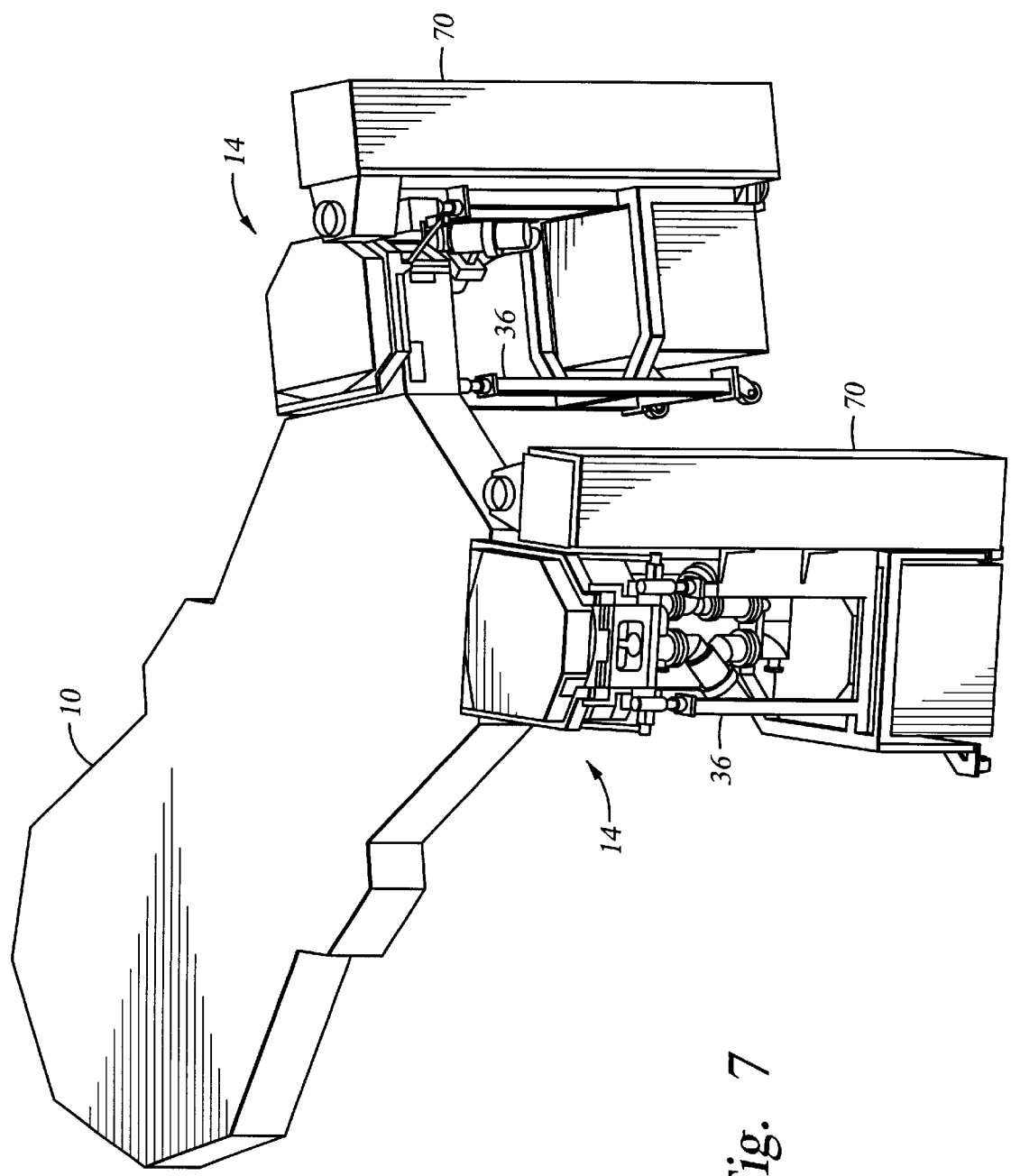
FIG. 7 is a partial perspective view of a cluster tool having an alternative gas panel in accordance with the invention.

FIG. 7 is a partial perspective view of a cluster tool 10 having an alternative gas panel 70 in accordance with the invention. The gas panel 70 includes a vertical housing disposed along the side of the chamber 14. In this configuration, the gas panel 70 may still be supported on the chamber cart 36 and allow pre-installation of all gas connections therebetween. However, the side-mounted gas panel 70 may be designed to receive gas from a gas delivery manifold disposed either above the cluster tool 10 or below the floor. The gas delivery manifold may include any combination of gas lines or sources, such as argon, nitrogen and helium as well as process gases.

While the foregoing is directed to the preferred embodiment of the present invention, other and further embodiments of the present invention may be devised without departing from the basic scope thereof, and the scope thereof is determined by the claims that follow.

What is claimed is:

1. A modular system for fabricating integrated circuits, comprising:
   a transfer chamber having a plurality of stations adapted to selectively connect a vacuum processing chamber to the transfer chamber;
   a gas supply manifold positioned above at least one of the vacuum processing chamber and the transfer chamber, the gas supply manifold having a first end in communication with a gas source and a plurality of second ends disposed at each of the plurality of stations;
   a vacuum processing chamber adapted to selectively connect to the transfer chamber at one of the plurality of stations; and
   a gas box positioned above at least one of the vacuum processing chamber and the transfer chamber and having a gas supply line having a first supply end in communication with the vacuum processing chamber, a second supply end adapted to selectively connect with one of the plurality of second ends of the gas supply manifold, and a flow control member disposed between the first supply end and the second supply end, wherein the vacuum processing chamber and the gas box selectively connect to any one of the plurality of stations.

2. The modular system of claim 1, wherein the vacuum processing chamber and the gas box are rigidly coupled.

3. The modular system of claim 2, wherein the vacuum processing chamber has a support member for securing the gas box.

4. A processing unit for a cluster tool the processing unit comprising:
   a vacuum processing chamber suitable for fabricating semiconductor devices; and
   a gas box rigidly fixed above the processing chamber, the gas box having a plurality of gas supply lines and a control member disposed in each of the plurality of gas supply lines providing selective delivery of a gas into the vacuum processing chamber, wherein each of the plurality of gas supply lines have a first end in communication with a gas source and a second end in communication with the vacuum processing chamber.

5. A modular processing system, the system comprising:
   a transfer chamber having a plurality of stations for communicating with additional chambers, each of the plurality of stations including a separation valve;
   at least one processing chamber in engagement with the transfer chamber via one of the plurality of stations, each of the at least one processing chambers being selectively in communication with the transfer chamber via actuation of the separation valve, and selectively detachable from the transfer chamber;
   a gas supply manifold in communication with a gas supply and having a plurality of chamber supply ends positioned proximate each of the plurality of stations at least one gas box positioned above each of the at least one processing chambers, the at least one gas box including a gas receiving line in communication with one of the plurality of chamber supply ends and a chamber end in communication with one of the at least one processing chambers.

6. A system for fabricating integrated circuits, comprising:
   a transfer chamber having a plurality of stations adapted to receive a processing unit;
   a plurality of processing units in selective communication with the transfer chamber, each of the plurality of processing units having a vacuum processing chamber and a gas box, wherein each gas box is positioned above at least one of the plurality of processing units and the transfer chamber and includes a plurality of gas supply lines, each of the plurality of gas supply lines having a first end in communication with the vacuum processing chamber, a second end in communication with a gas source and a control member disposed in each of the plurality of gas supply lines between the first and second ends.

7. The system of claim 6, wherein the control member provides selective delivery of a gas into the vacuum processing chamber of the corresponding processing unit and no gases to any other vacuum processing chambers.

8. The system of claim 6, further comprising:

a gas supply manifold positioned above at least one of the plurality of processing units and the transfer chamber, the gas supply manifold having a first manifold end in communication with a gas source and a plurality of second manifold ends terminating adjacent each of the plurality of processing units for disconnectable connection between one of the plurality of second manifold ends with a gas supply line of a gas box.

9. The system of claim 8, further comprising a hood covering the gas supply manifold between the first and second ends.

10. The system of claim 8, wherein the vacuum processing chamber and the gas box are cooperatively supported on a cart.

11. The system of claim 8, wherein the plurality of second manifold ends of the gas supply manifold are disposed in a fixed relationship to each of the plurality of processing stations.

12. The system of claim 11, wherein the gas supply lines of the gas box are disposed in a fixed relationship to each of the plurality of vacuum processing stations so that connecting an individual vacuum processing station to the transfer chamber positions the gas supply lines of the gas box immediately adjacent the second manifold ends of the gas supply manifold.

13. A system for fabricating integrated circuits, comprising:

a transfer chamber having a plurality of stations for receiving vacuum processing chambers, each station having a slit valve;

a plurality of gas manifolds positioned above the transfer chamber, each manifold communicating a gas source to a terminal end positioned proximate the slit valve at each of the stations;

a processing unit comprising a vacuum processing chamber having an opening for communicating with the slit valve and a gas box positioned above the processing unit and having one or more gas lines for communicating with the terminal ends of the gas manifolds, wherein the processing unit may be selectively connected at any one of the plurality of stations.

14. The system of claim 13, further comprising a process control computer having a plurality of electronic sensor wires and control wires extending to a first connector positioned at any one of the plurality of stations, wherein each processing unit further comprises a plurality of sensors and controllers having a plurality of electronic sensor wires extending to a second connector, wherein the second connector may be selectively connected to the first connector at any one of the plurality of stations.

* * * * *

UNITED STATES PATENT AND TRADEMARK OFFICE
CERTIFICATE OF CORRECTION

PATENT NO.   : 6,277,199 B1
DATED        : August 21, 2001
INVENTOR(S)  : Lei et al.

It is certified that error appears in the above-identified patent and that said Letters Patent is hereby corrected as shown below:

<u>Column 8,</u>
Line 44, please insert -- ; and -- after "stations".

Signed and Sealed this

Thirty-first Day of December, 2002

JAMES E. ROGAN
*Director of the United States Patent and Trademark Office*